(12) United States Patent
Miura

(10) Patent No.: US 8,860,215 B2
(45) Date of Patent: Oct. 14, 2014

(54) SEMICONDUCTOR DEVICE AND METHOD OF MANUFACTURING THE SAME

(75) Inventor: Yumiko Miura, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 14 days.

(21) Appl. No.: 13/327,292

(22) Filed: Dec. 15, 2011

(65) Prior Publication Data

US 2013/0049191 A1  Feb. 28, 2013

(30) Foreign Application Priority Data

Aug. 24, 2011  (JP) ................. 2011-182221

(51) Int. Cl.
| | |
|---|---|
| *H01L 23/498* | (2006.01) |
| *H01L 25/065* | (2006.01) |
| *H01L 23/00* | (2006.01) |
| *H01L 21/56* | (2006.01) |
| *H01L 23/31* | (2006.01) |

(52) U.S. Cl.
CPC ..... *H01L 23/498* (2013.01); *H01L 2225/06541* (2013.01); *H01L 25/0652* (2013.01); *H01L 2225/0651* (2013.01); *H01L 2225/06513* (2013.01); *H01L 2224/97* (2013.01); *H01L 2225/06565* (2013.01); *H01L 23/49811* (2013.01); *H01L 24/97* (2013.01); *H01L 23/49827* (2013.01); *H01L 21/561* (2013.01); *H01L 23/3128* (2013.01); *H01L 2225/06517* (2013.01); *H01L 2225/06568* (2013.01)
USPC ........... 257/737; 257/659; 257/678; 257/733; 257/787; 257/E23.194

(58) Field of Classification Search
USPC ................. 257/659, 678–733, 737, 787–796, 257/E23.001–E23.194
See application file for complete search history.

(56) References Cited

U.S. PATENT DOCUMENTS

| | | | |
|---|---|---|---|
| 2006/0131719 A1* | 6/2006 | Nakayama | ..................... 257/686 |
| 2008/0042274 A1* | 2/2008 | Bang et al. | ..................... 257/737 |
| 2008/0150096 A1 | 6/2008 | Ishio | |

FOREIGN PATENT DOCUMENTS

JP  2008-159718 A  7/2008

* cited by examiner

*Primary Examiner* — Mamadou Diallo
(74) *Attorney, Agent, or Firm* — Foley & Lardner LLP

(57) ABSTRACT

A semiconductor device has a wiring substrate, a first semiconductor chip, a second semiconductor chip, and a sealing member. The second semiconductor chip has a chip-layered structure with a plurality of semiconductor chip components stacked in the height direction of the semiconductor device. The first semiconductor chip has an upper surface located at the same height from a surface of the wiring substrate as an upper surface of the second semiconductor chip.

23 Claims, 5 Drawing Sheets

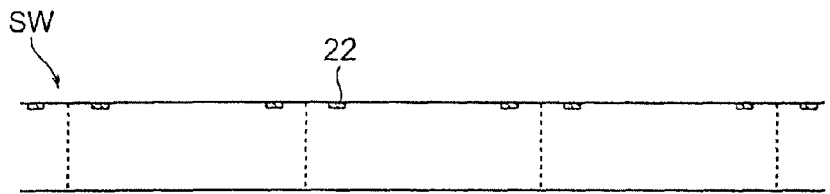
FIG. 3A
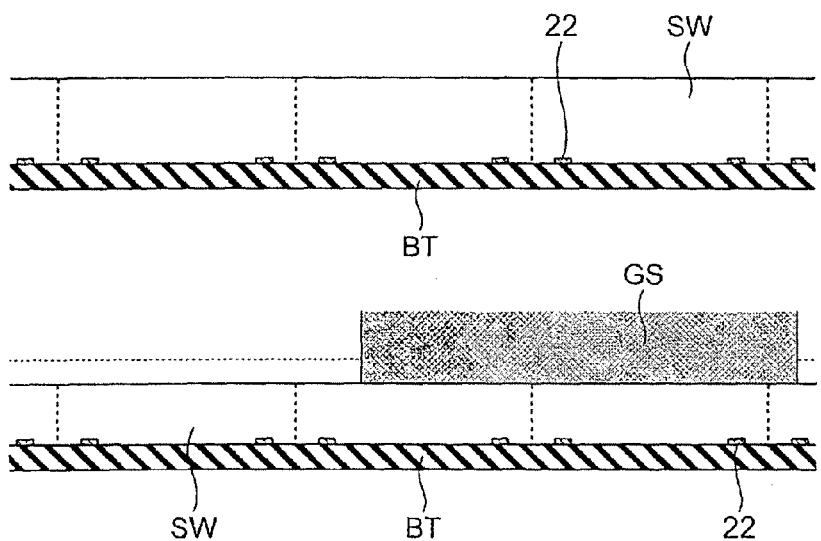
FIG. 3B
FIG. 3C
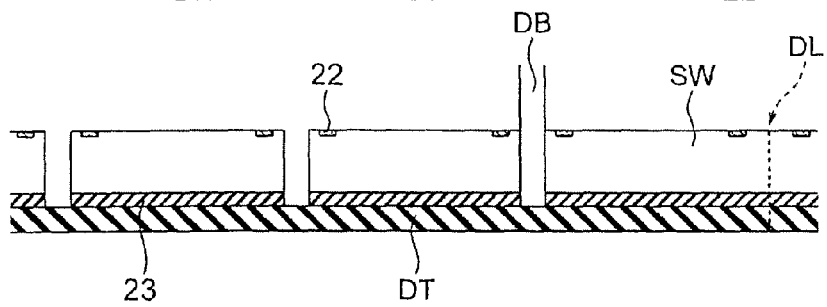
FIG. 3D
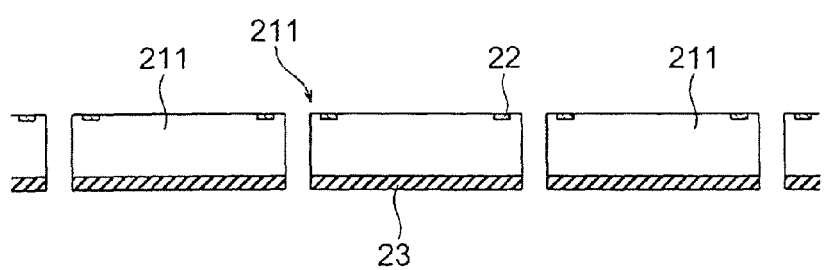
FIG. 3E

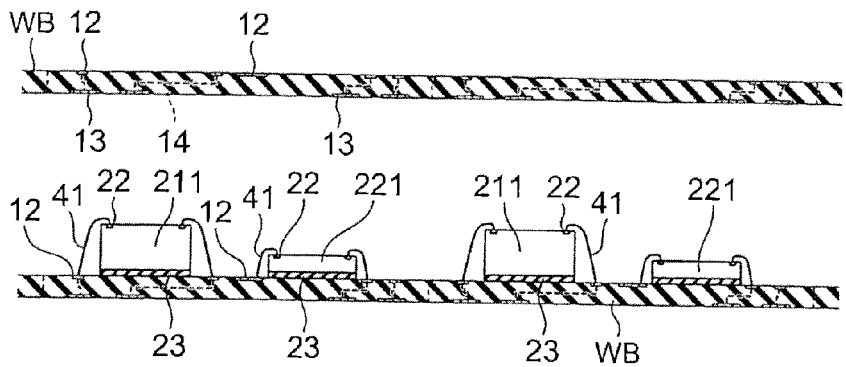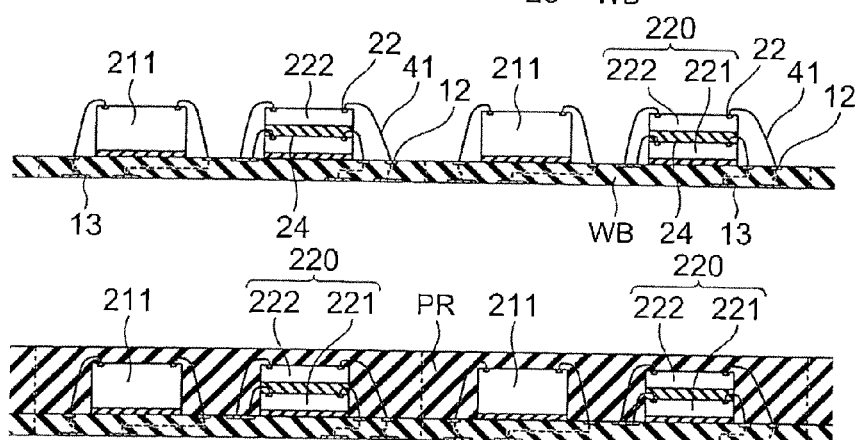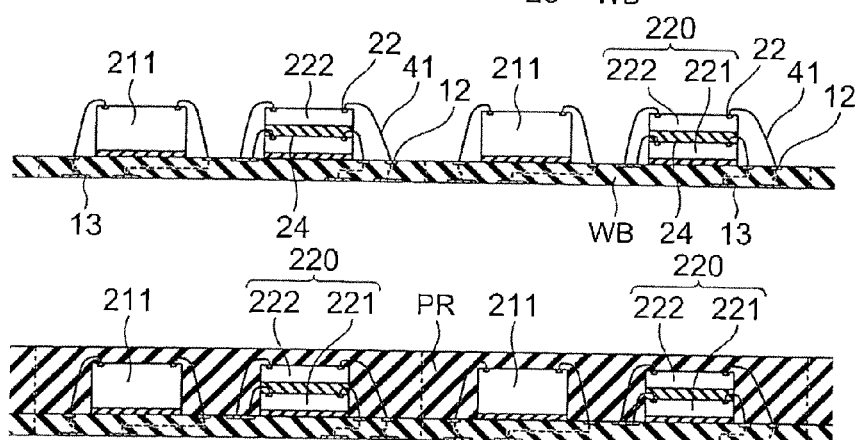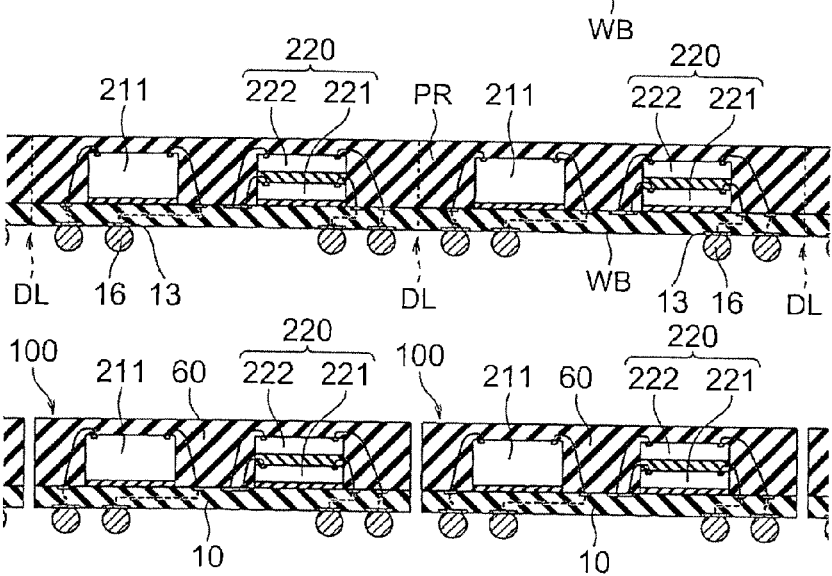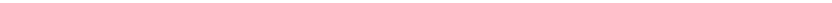

SEMICONDUCTOR DEVICE AND METHOD OF MANUFACTURING THE SAME

This application is based upon and claims the benefit of priority from Japanese patent application No. 2011-182221, filed on Aug. 24, 2011, the disclosure of which is incorporated herein in its entirety by reference.

BACKGROUND

1. Field of the Invention:

The present invention relates to a semiconductor device, and more particularly to a multi-chip package type semiconductor device having a plurality of semiconductor chips within a package.

2. Description of the Related Art:

A multi-chip package (MCP) type semiconductor device has a plurality of semiconductor chips within a package.

For example, an MCP type semiconductor device is disclosed in JP-A 2008-159718.

The MCP type semiconductor device disclosed in FIG. 8 of JP-A 2008-159718 has a wiring substrate (silicon substrate 30) and three semiconductor chips (electronic components 31) arranged in parallel on the wiring substrate. Those semiconductor chips have the same specification. For example, the semiconductor chips have the same height.

Meanwhile, an MCP type semiconductor device in which a chip-layered structure having a plurality of semiconductor chips stacked in the thickness direction of the semiconductor device is mounted within a package has been proposed and put into practical use according to recent trends of high density packaging of semiconductor devices and enhancement of functionality.

Referring to FIG. 1, an MCP type semiconductor device 700 having a chip-layered structure, as the related art of the present invention, includes a wiring substrate 10 and three semiconductor chips 711, 721, and 722 mounted on the wiring substrate 10. Among those semiconductor chips, the semiconductor chips 721 and 722 are stacked as semiconductor chip components in the height direction (thickness direction) of the semiconductor chips 721 and 722. Thus, the semiconductor chips 721 and 722 form a chip-layered structure 720. In FIG. 1, the reference numeral 12 denotes a connection pad, the reference numeral 13 a land, the reference numeral 16 a solder ball, the reference numeral 72 an electrode pad, the reference numerals 73 and 74 adhesive members, and the reference numeral 41 a wire.

For example, another MCP type semiconductor device having a chip-layered structure other than the semiconductor device shown in FIG. 1 is disclosed in FIG. 3 of JP-A 2008-159718. This semiconductor device has a plurality of components mounted symmetrically with respect to the centers of two wiring substrates (a substrate 3A and a substrate 3B) in order to suppress warp of the semiconductor device. However, this semiconductor device uses two wiring substrates (the substrate 3A and the substrate 3B). Therefore, the manufacturing cost of the semiconductor device increases.

In the MCP type semiconductor devices having a chip-layered structure according to the related art of the present invention, which include the example illustrated in FIG. 1, the thickness from an upper surface of a first semiconductor chip to a surface of a sealing member is different from the thickness from an upper surface of a chip-layered structure (a second semiconductor chip) to the surface of the sealing member. Accordingly, the sealing member is unbalanced on the wiring substrate. Thus, uneven torsion or strain is caused to the semiconductor device by shrinkage of the sealing member on curing. Such torsion or strain makes it difficult to mount the semiconductor device onto a motherboard.

SUMMARY

It is, therefore, an object of the present invention to provide a semiconductor device that is prevented from generating torsion or strain and is not inhibited from being mounted onto a motherboard.

According to the present invention, there is provided a semiconductor device comprising: a wiring substrate; a first semiconductor chip mounted on the wiring substrate; a second semiconductor chip mounted on the wiring substrate so that an upper surface of the first semiconductor chip is located at the same height from a surface of the wiring substrate as an upper surface of the second semiconductor chip, the second semiconductor chip having a chip-layered structure with a plurality of semiconductor chip components stacked in a height direction of the semiconductor device; and a sealing member covering the first semiconductor chip and the second semiconductor.

According to the present invention, there is further provided a semiconductor device comprising: a wiring substrate including a first region and a second region; a first semiconductor chip mounted over the first region of the wiring substrate; a second semiconductor chip including a first surface and a second surface opposed to the first surface, and the second semiconductor chip stacked over the first semiconductor chip so that the second surface faces the first semiconductor chip; a third semiconductor chip including a third surface and a fourth surface opposed to the third surface, the third semiconductor chip being mounted over the second region of the wiring substrate so that the fourth surface faces the wiring substrate; and an insulating layer formed over the wiring substrate to cover the first, second and third semiconductor chips, the insulating layer including an exposed surface facing away from the wiring substrate. A distance between the third surface of the third semiconductor chip and the exposed surface of the insulating layer is substantially equal to a distance between the first surface of the second semiconductor chip and the exposed surface of the insulating layer.

According to the present invention, there is still further provided a semiconductor device comprising: a wiring substrate including a top surface and a plurality of connection pads formed on the top surface, the top surface including a first region and a second region; a first semiconductor chip including a first surface and a plurality of first electrodes formed on the first surface, the first semiconductor chip being mounted over the first region of the wiring substrate; a second semiconductor chip including a second surface, a third surface opposed to the second surface and a plurality of second electrodes formed on the second surface, the second semiconductor chip being stacked over the first semiconductor chip so that the third surface faces the first semiconductor chip; a third semiconductor chip including a fourth surface, a fifth surface opposed to the fourth surface and a plurality of third electrodes formed on the fourth surface, the third semiconductor chip being mounted over the second region of the wiring substrate so that the fifth surface faces the wiring substrate; a plurality of first wires electrically coupling the first electrodes of the first semiconductor chip to the connection pads of the wiring substrate; a plurality of second wires electrically coupling the second electrodes of the second semiconductor chip to the connection pads of the wiring substrate; a plurality of third wires electrically coupling the third electrodes of the third semiconductor chip to the connection pads of the wiring substrate; and an insulating layer formed over the top surface of the wiring substrate to cover the first semiconductor chip, the second semiconductor chip, third semiconductor chip, the first wires, the second wires and the third wires. A height of the fourth surface of the third semiconductor chip from the top surface of the wiring substrate is substantially equal to a height of the second surface of the second semiconductor chip from the top surface of the wiring substrate.

According to the present invention, there is further provided a method of manufacturing a semiconductor device, the method comprising: mounting a first semiconductor chip and a second semiconductor chip on a wiring substrate so that an upper surface of the first semiconductor chip is located at the same height from a surface of the wiring substrate as an upper surface of the second semiconductor chip, the mounting process including stacking a plurality of semiconductor chip components in a height direction of the semiconductor device to form the second semiconductor chip having a chip-layered structure; and covering the first semiconductor chip and the second semiconductor chip mounted on the wiring substrate with a sealing member.

BRIEF DESCRIPTION OF THE DRAWINGS:

FIGS. 3A to 3E are cross-sectional views showing a manufacturing process of semiconductor chips and are particularly explanatory of a method of manufacturing the semiconductor device shown in FIG. 2.

FIGS. 4A to 4F are cross-sectional views showing an assembly process of a semiconductor device and are particularly explanatory of a method of manufacturing the semiconductor device shown in FIG. 2.

DETAILED DESCRIPTION OF THE PREFERRED EMBODIMENTS:

A semiconductor device according to the present invention has a wiring substrate, a first semiconductor chip mounted on the wiring substrate, a second semiconductor chip mounted on the wiring substrate, and a sealing member covering the first and second semiconductor chips. The second semiconductor chip has a chip-layered structure with a plurality of semiconductor chip components stacked in the height direction (thickness direction) of the semiconductor device.

Particularly, according to the present invention, the first semiconductor chip has an upper surface located at the same height from a surface of the wiring substrate as an upper surface of the second semiconductor chip.

Specifically, in the semiconductor device according to the present invention, the thickness from the upper surface of the first semiconductor chip to a surface of the sealing member is equal to the thickness from the upper surface of the second semiconductor chip (chip-layered structure) to the surface of the sealing member. Therefore, the sealing member is satisfactorily balanced on the wiring substrate. Thus, uneven torsion or strain is unlikely to be generated in the semiconductor device during a curing process of the sealing member or the like. Therefore, the semiconductor device is not inhibited from being mounted onto a motherboard.

Specific embodiments of a semiconductor device according to the present invention will be described below with reference to FIGS. 2 to 8.

Embodiment 1

Figure 1:
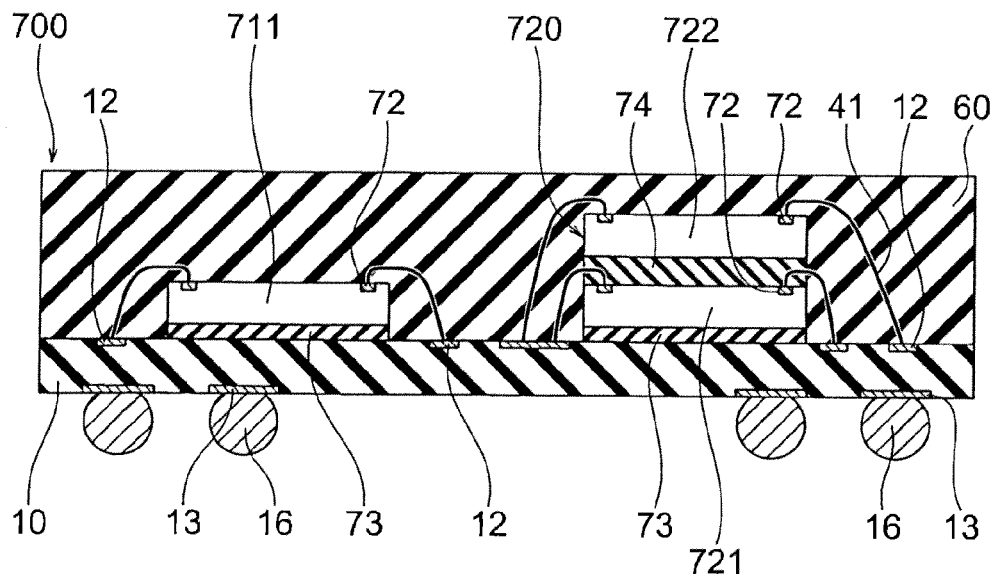
FIG. 1 is a cross-sectional view showing a semiconductor device according to the related art of the present invention.
Figure 2:
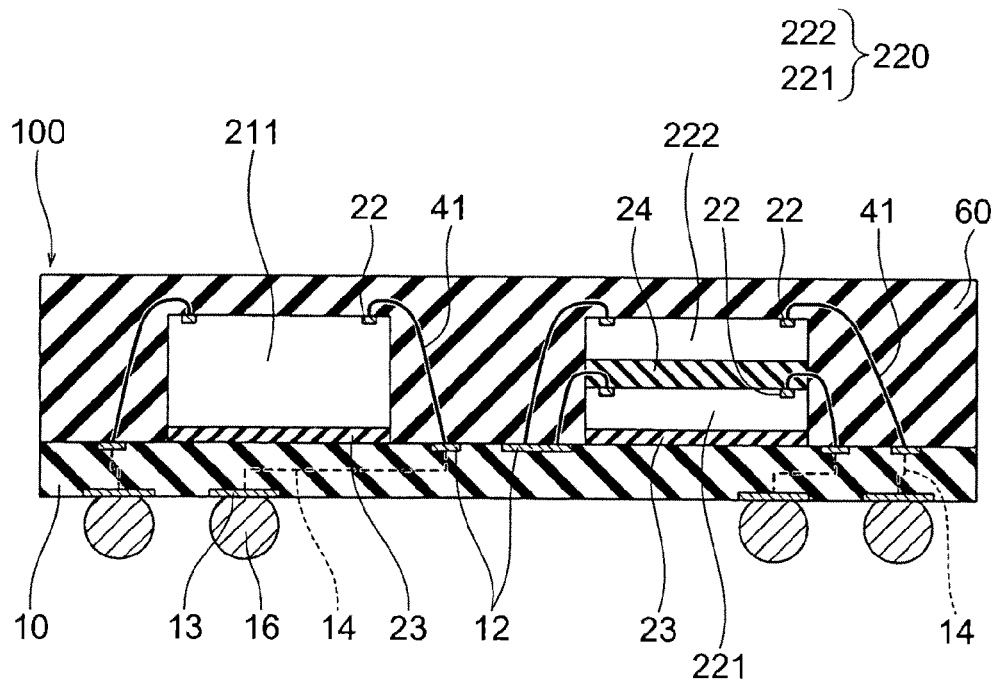
FIG. 2 is a cross-sectional view showing a semiconductor device according to Embodiment 1 of the present invention.

Referring to FIG. 2, a semiconductor device 100 according to Embodiment 1 of the present invention has a single wiring substrate 10, a first semiconductor chip 211 mounted on the wiring substrate 10, a second semiconductor chip 220 mounted next to the first semiconductor chip 211 on the wiring substrate 10, and a sealing member 60 covering the first semiconductor chip 211 and the second semiconductor chip 220.

For example, the first semiconductor chip 211 and the second semiconductor chip 220 are semiconductor chips having a memory circuit formed thereon. Each of the first semiconductor chip 211 and the second semiconductor chip 220 has electrode pads 22 formed near edges of its upper surface.

For example, the wiring substrate 10 includes a glass epoxy substrate having a thickness of 0.2 mm. A predetermined wiring pattern is formed on the glass epoxy substrate. The wiring substrate 10 has a plurality of connection pads 12 arranged on one surface of the wiring substrate 10 and a plurality of lands 13 formed on the other surface of the wiring substrate 10. The connection pads 12 are electrically connected to the corresponding lands 13 by wires 14.

The first semiconductor chip 211 and the second semiconductor chip 220 are mounted on the wiring substrate 10 by adhesive members 23. Examples of the adhesive members 23 include a die attached film (DAF).

The second semiconductor chip 220 has a chip-layered structure with a plurality of semiconductor chip components 221 and 222 stacked in the height direction of the semiconductor device 100. For example, the semiconductor chip component 221 is mounted on the wiring substrate 10 by the adhesive member 23 such as a DAF. For example, the semiconductor chip component 222 is stacked on the semiconductor chip component 221 with an adhesive member 24 such as a film-on-wire (FOW) being interposed between the semiconductor chip components 221 and 222.

The first semiconductor chip 211 and the semiconductor chip components 221 and 222 of the second semiconductor chip 220 are connected to the connection pads 12 formed on the surface of the wiring substrate 10 by wires 41 extending from the electrode pads 22.

Particularly, in the semiconductor device 100, the upper surface of the first semiconductor chip 211 is located at the same height from the surface of the wiring substrate 10 as the upper surface of the second semiconductor chip 220. More specifically, the height of the upper surface of the first semiconductor chip 211 from the surface of the wiring substrate 10, including the adhesive member 23, is equal to the height of the upper surface of the second semiconductor chip 220 from the surface of the wiring substrate 10.

For example, the first semiconductor chip 211 has a thickness of 160 μm including the thickness of the adhesive member 23. For example, the semiconductor chip component 221 of the second semiconductor chip 220, which has a chip-layered structure, has a thickness of 50 μm. For example, the semiconductor chip component 222 has a thickness of 50 μm. The total thickness of the adhesive member 23 such as a DAF and the adhesive member 24 such as an FOW is 60 µm. Thus, the total thickness of the second semiconductor chip 220 is 160 µm.

The height of an upper surface of the sealing member 60 covering the first semiconductor chip 211 from the surface of the wiring substrate 10 is equal to the height of an upper surface of the sealing member 60 covering the second semiconductor chip 220 from the surface of the wiring substrate 10. In other words, the upper surface of the sealing member 60 including an area covering the semiconductor chip 211 is flat.

Specifically, in the semiconductor device 100, the thickness from the upper surface of the first semiconductor chip 211 to the surface of the sealing member 60 is equal to the thickness from the upper surface of the second semiconductor chip (chip-layered structure) 220 to the surface of sealing member 60. Therefore, the sealing member 60 is satisfactorily balanced on the wiring substrate 10. Thus, uneven torsion or strain is unlikely to be caused to the entire semiconductor device 100 by shrinkage of the sealing member 60 on curing. Therefore, the semiconductor device 100 is not inhibited from being mounted onto a motherboard. Furthermore, the thickness of the first semiconductor chip 211 is made equal to the thickness of the second semiconductor chip (chip-layered structure) 220. Accordingly, the amount of resin for the sealing member 60 can be reduced. Thus, further reduction in warp can be expected.

Furthermore, the thickness of the semiconductor device 100 can be reduced as compared to a case where three chips are stacked. Since a stack of two chips is arranged next to one chip, routing wires can be shortened as compared to the case where three chips are stacked. Therefore, characteristics of memory chips can be improved.

Furthermore, in the semiconductor device 100, each of the first semiconductor chip 211 and the second semiconductor chip 220 has a bottom contacting the wiring substrate 10. The bottom of the first semiconductor chip 211 has the same area as the bottom of the second semiconductor chip 220.

Moreover, in the semiconductor device 100, the first semiconductor chip 211 and the second semiconductor chip 220 are mounted on the surface of the wiring substrate 10 at positions that are symmetrical with respect to each other.

There will be described a method of manufacturing the semiconductor device 100, which includes a manufacturing process of the semiconductor chips and an assembly process of the semiconductor device.

[Manufacturing Process of Semiconductor Chips]

The semiconductor device 100 includes three semiconductor chips of the first semiconductor chip 211, the semiconductor chip component 221, and the semiconductor chip component 222. Those semiconductor chips only differ from each other in thickness and type of an adhesive member used. Those semiconductor chips can be manufactured in the same process. Therefore, the following description is focused on a manufacturing process of the first semiconductor chip 211. The details of manufacturing processes of the semiconductor chip component 221 and the semiconductor chip component 222 are omitted herein.

First, a semiconductor wafer SW having certain circuits and electrode pads 22 formed on one surface (front face) of the semiconductor wafer SW is prepared as illustrated in FIG. 3A.

Then, as shown in FIG. 3B, the front face of the semiconductor wafer SW is attached and fixed to a backgrinding tape BT.

Thereafter, as shown in FIG. 3C, the other surface (rear face) of the semiconductor wafer SW is ground into a predetermined thickness by a backgrinding stone GS during a wafer backgrinding process. Thus, the thickness of the semiconductor wafer SW is reduced.

In this example, the semiconductor wafer SW is ground into a thickness of 150 µm to 170 µm in order to produce the first semiconductor chip 211. The semiconductor wafer SW is ground into a thickness of 50 µm in the case of the semiconductor chip component 221 or 222.

Next, the rear face of the semiconductor wafer SW whose thickness has been reduced to a desired value is attached and fixed to a dicing tape DT with an adhesive member layer being interposed between the semiconductor wafer SW and the dicing tape DT. The backgrinding tape BT is removed from the front face of the semiconductor wafer SW.

In this example, an adhesive member 23 such as a DAF is formed on the rear face of the semiconductor wafer SW in order to produce the first semiconductor chip 211. In the case of the semiconductor chip component 221, an adhesive member 23 such as a DAF is also formed on the rear face of the semiconductor wafer SW. In the case of the semiconductor chip component 222, an adhesive member such as an FOW is formed on the rear face of the semiconductor wafer SW.

Then, as shown in FIG. 3D, the semiconductor wafer SW and the adhesive member 23 are cut along a plurality of dicing lines DL of the semiconductor wafer SW by a dicing blade DB rotating at a high speed during a dicing process.

As shown in FIG. 3E, the first semiconductor chip 211 with the adhesive member 23 formed on the rear face thereof is thus produced.

The semiconductor chip component 221 or 222, which has a thickness different from the thickness of the first semiconductor chip 211, can be produced in the same process as the process for the first semiconductor chip 211 by adjusting the amount of grinding the rear face of the semiconductor wafer SW.

[Assembly Process of Semiconductor Device]

First, a base wiring substrate WB as shown in FIG. 4A is produced and prepared. The base wiring substrate WB corresponds to wiring substrates 10 for a plurality of semiconductor devices 100. The base wiring substrate WB has connection pads 12 formed on one surface (front face) thereof and lands 13 formed on the other surface (rear face) thereof. Furthermore, the base wiring substrate WB includes wires 14 formed therein. The lands 13 are connected to the corresponding connection pads 12 by those wires 14.

Then, as shown in FIG. 4B, the first semiconductor chips 211 and the semiconductor chip components 221 are arranged next to each other at predetermined locations of the front face of the base wiring substrate WB, and bonded and fixed to the front face of the base wiring substrate WB by the adhesive members 23 such as DAFs.

Furthermore, each of the electrode pads 22 of the first semiconductor chips 211 and the semiconductor chip components 221 fixed on the base wiring substrate WB is connected to the corresponding connection pad 12 by a wire 41. For example, the wires 41 are made of Au. A wire bonding apparatus (not shown) may be used to connect the wires 41. For example, the wire connection is performed by ball bonding that uses an ultrasonic thermo-compression bonding method. Specifically, an end of the wire 41 where a ball has been formed by fusion is bonded to the electrode pad 22 by an ultrasonic thermo-compression bonding method. Another end of the wire 41 is bonded to the corresponding connection pad 12 by an ultrasonic thermo-compression bonding method so that the wire 41 draws a predetermined loop shape.

Thereafter, as shown in FIG. 4C, the semiconductor chip components 222 are bonded and fixed to the semiconductor chip components 221 with adhesive members 24 such as FOWs being interposed between the semiconductor chip components 221 and 222. At that time, second semiconductor chips (chip-layered structures) 220 of the semiconductor chip components 221 and 222 are constructed.

Furthermore, each of the electrode pads 22 of the semiconductor chip components 222 fixed on the semiconductor chip components 221 is connected to the corresponding connection pad 12 by a wire 41.

The bonding of the wires 41 for the first semiconductor chips 211 may not be conducted in the same manner as the bonding of the wires 41 for the semiconductor chip components 221 and may be conducted in the same manner as the bonding of the wires 41 for the semiconductor chip components 222, which are stacked in the uppermost layer. In such a case, since the electrode pads 22 of the first semiconductor chips 211 are located at the same height as the electrode pads 22 of the semiconductor chip components 222, it is not necessary to change the height of a manipulator of a wire bonding apparatus depending upon the height of the electrode pads. Therefore, a bonding process can be performed efficiently.

Next, as shown in FIG. 4D, a collective sealing member PR is formed on the front face of the base wiring substrate WB by molding.

Then, as shown in FIG. 4E, solder balls 16 are respectively mounted on the lands 13 formed on the rear face of the base wiring substrate WB.

Those solder balls 16 are used as external terminals of the semiconductor devices 100. For example, the solder balls 16 may be mounted with a suction mechanism (not shown) having a plurality of suction holes arranged so as to correspond to the lands 13. In this case, a plurality of solder balls are attracted and held by the suction mechanism, a flux is transferred to the solder balls being held. The solder balls are collectively mounted on the lands 13 of the base wiring substrate WB. Then the solder balls and the lands 13 are connected and fixed to each other by a reflow process.

Thereafter, the collective sealing member PR is bonded to a dicing tape (not shown). Thus, the collective sealing member PR and the base wiring substrate WB are supported by the dicing tape. Then, as shown in FIG. 4F, the base wiring substrate WB and the collective sealing member PR are cut along dicing lines DL by a dicing blade (not shown).

Thus, the base wiring substrate WB is divided into individual semiconductor devices 100. The semiconductor device 100 as shown in FIG. 2 is obtained by picking up one of the divided semiconductor devices 100 from the dicing tape.

[Variation of Embodiment 1]

A variation of the semiconductor device according to Embodiment 1 of the present invention differs from the semiconductor device according to Embodiment 1 in thickness of the semiconductor chips and in thickness of the adhesive members. The drawings and description of Embodiment 1 are cited to refer to components or operations that are the same as or similar to Embodiment 1. The details of those components or operations are omitted from the following description.

Figure 5:
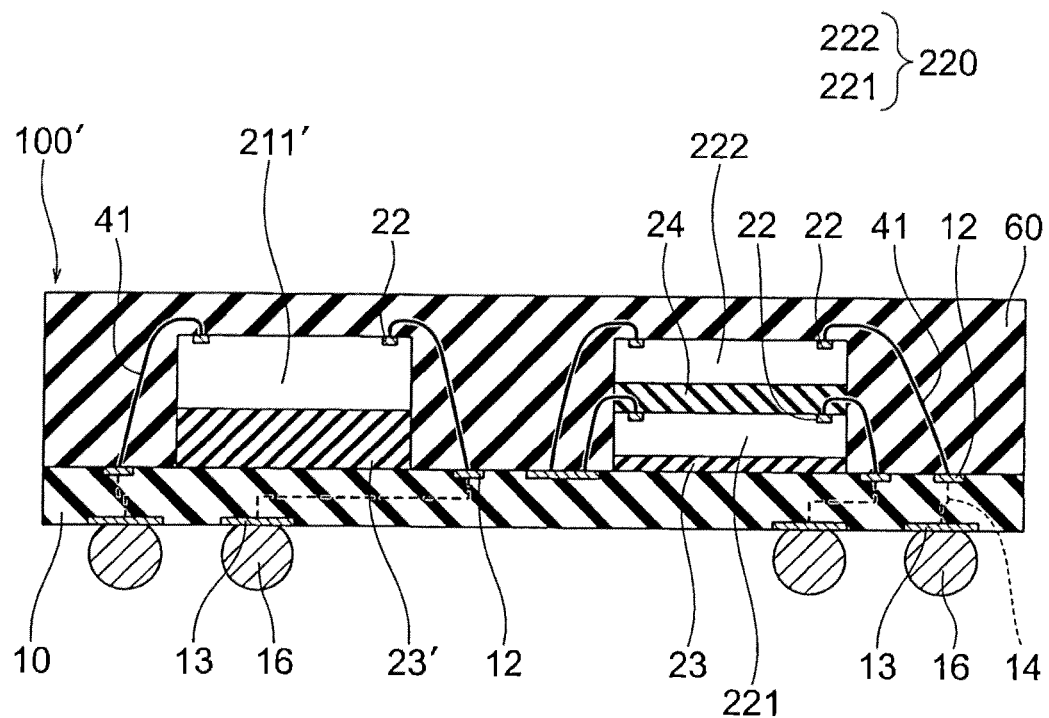
FIG. 5 is a cross-sectional view showing a semiconductor device according to a variation of Embodiment 1 of the present invention.

Referring to FIG. 5, a semiconductor device 100' as a variation of Embodiment 1 of the present invention has a single wiring substrate 10, a first semiconductor chip 211' mounted on the wiring substrate 10, a second semiconductor chip 220 mounted next to the first semiconductor chip 211' on the wiring substrate 10, and a sealing member 60 covering the first semiconductor chip 211' and the second semiconductor chip 220.

For example, the wiring substrate 10 includes a glass epoxy substrate having a thickness of 0.2 mm. A predetermined wiring pattern is formed on the glass epoxy substrate.

The first semiconductor chip 211' and the second semiconductor chip 220 are mounted on the wiring substrate 10 by an adhesive member 23' and an adhesive member 23, respectively. Examples of the adhesive member 23' and the adhesive member 23 include a die attached film (DAF).

The second semiconductor chip 220 has a chip-layered structure with a plurality of semiconductor chip components 221 and 222 stacked in the height direction of the semiconductor device 100'. For example, the semiconductor chip component 222 is stacked on the semiconductor chip component 221 with an adhesive member 24 such as a film-on-wire (FOW) being interposed between the semiconductor chip components 221 and 222.

The first semiconductor chip 211' and the semiconductor chip components 221 and 222 of the second semiconductor chip 220 are connected to the connection pads 12 formed on the surface of the wiring substrate 10 by wires 41 extending from the electrode pads 22.

The height of an upper surface of the sealing member 60 covering the first semiconductor chip 211' from the surface of the wiring substrate 10 is equal to the height of an upper surface of the sealing member 60 covering the second semiconductor chip 220 from the surface of the wiring substrate 10. In other words, the upper surface of the sealing member 60 including an area covering the semiconductor chip 211' is flat.

In the semiconductor device 100', the height of the upper surface of the first semiconductor chip 211' from the surface of the wiring substrate 10 is equal to the height of the upper surface of the second semiconductor chip 220 from the surface of the wiring substrate 10 as with the semiconductor device 100. The height of the upper surface of the first semiconductor chip 211' from the surface of the wiring substrate 10, including the adhesive member 23' such as a DAF, is equal to the height of the upper surface of the second semiconductor chip 220 from the surface of the wiring substrate 10.

For example, the first semiconductor chip 211' has a thickness of 160 μm including the thickness of the adhesive member 23'. For example, the semiconductor chip component 221 of the second semiconductor chip 220, which has a chip-layered structure, has a thickness of 50 μm. For example, the semiconductor chip component 222 has a thickness of 50 μm. The total thickness of the adhesive member 23 such as a DAF and the adhesive member 24 such as an FOW is 60 μm. Thus, the total thickness of the second semiconductor chip 220 is 160 μm.

Particularly, in this variation illustrated in FIG. 5, the first semiconductor chip 211' is thinner while the adhesive member 23' is thicker as compared to Embodiment 1 illustrated in FIG. 2. However, in the semiconductor device 100' of this variation, the thickness from the upper surface of the first semiconductor chip 211' to the surface of the sealing member 60 is equal to the thickness from the upper surface of the second semiconductor chip (chip-layered structure) 220 to the surface of the sealing member 60 as with Embodiment 1. Therefore, the sealing member 60 is satisfactorily balanced on the wiring substrate 10. Thus, uneven torsion or strain is unlikely to be caused to the entire semiconductor device 100' by shrinkage of the sealing member 60 on curing. Therefore, the semiconductor device 100' is not inhibited from being mounted onto a motherboard. Furthermore, the thickness of the first semiconductor chip 211' is made equal to the thickness of the second semiconductor chip (chip-layered structure) 220. Accordingly, the amount of resin for the sealing member 60 can be reduced. Thus, further reduction in warp can be expected.

Furthermore, in the semiconductor device 100', each of the first semiconductor chip 211' and the second semiconductor chip 220 has a bottom contacting the wiring substrate 10. The bottom of the first semiconductor chip 211' has the same area as the bottom of the second semiconductor chip 220.

Moreover, in the semiconductor device 100', the first semiconductor chip 211' and the second semiconductor chip 220 are mounted on the surface of the wiring substrate 10 at positions that are symmetrical with respect to each other.

Embodiment 2

A semiconductor device according to Embodiment 2 of the present invention differs from the semiconductor device according to Embodiment 1 in configuration of the semiconductor chip (chip-layered structure). The drawings and description of Embodiment 1 are cited to refer to components or operations that are the same as or similar to Embodiment 1. The details of those components or operations are omitted from the following description.

Figure 6:
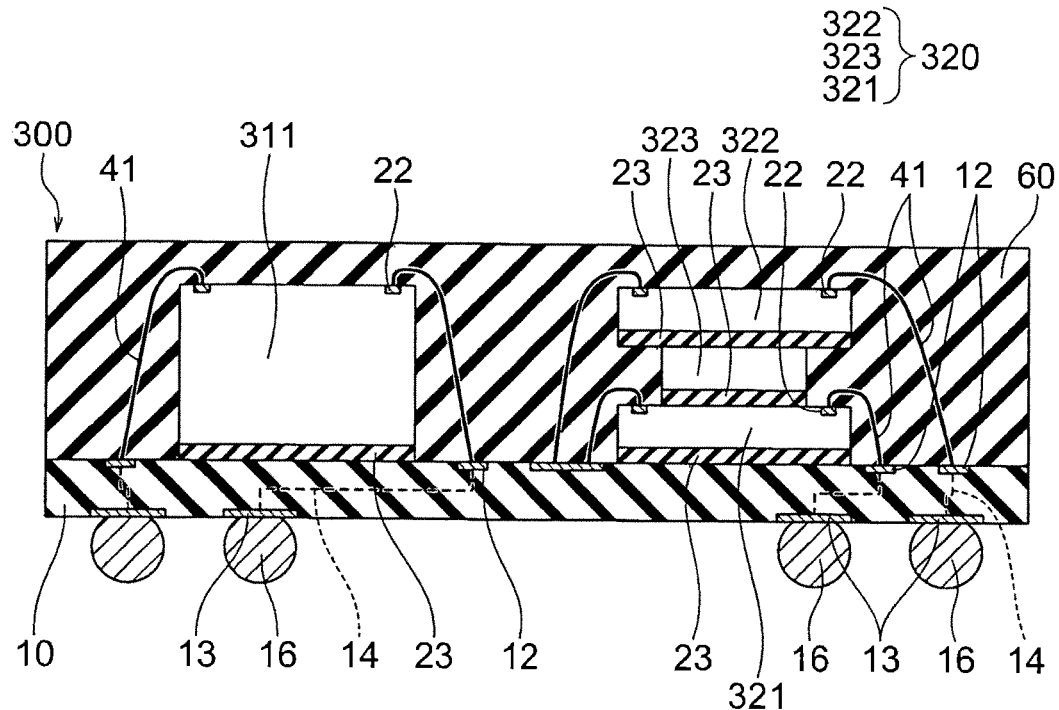
FIG. 6 is a cross-sectional view showing a semiconductor device according to Embodiment 2 of the present invention.

Referring to FIG. 6, a semiconductor device 300 according to Embodiment 2 of the present invention has a single wiring substrate 10, a first semiconductor chip 311 mounted on the wiring substrate 10, a second semiconductor chip 320 mounted next to the first semiconductor chip 311 on the wiring substrate 10, and a sealing member 60 covering the first semiconductor chip 311 and the second semiconductor chip 320.

For example, the wiring substrate 10 includes a glass epoxy substrate having a thickness of 0.2 mm. A predetermined wiring pattern is formed on the glass epoxy substrate.

The first semiconductor chip 311 and the second semiconductor chip 320 are mounted on the wiring substrate 10 by adhesive members 23. Examples of the adhesive members 23 include a die attached film (DAF).

The second semiconductor chip 320 has a chip-layered structure with a plurality of semiconductor chip components 321 and 322 and a spacer 323 stacked in the height direction of the semiconductor device 300. The upper semiconductor chip component 322 is stacked on the lower semiconductor chip component 321 with the spacer 323 and an adhesive member 23 such as a DAF being interposed between the semiconductor chip components 321 and 322.

Specifically, in Embodiment 2, the spacer 323 is stacked on the lower semiconductor chip component 321 so that the electrode pads 22 of the semiconductor chip component 321, from which the wires 41 extend, are exposed. The upper semiconductor chip component 322 is stacked on the lower semiconductor chip component 321 with the spacer 323 being interposed between the semiconductor chip components 321 and 322.

The first semiconductor chip 311 and the semiconductor chip components 321 and 322 of the second semiconductor chip 320 are connected to the connection pads 12 formed on the surface of the wiring substrate 10 by the wires 41 extending from the electrode pads 22.

The height of an upper surface of the sealing member 60 covering the first semiconductor chip 311 from the surface of the wiring substrate 10 is equal to the height of an upper surface of the sealing member 60 covering the second semiconductor chip 320 from the surface of the wiring substrate 10. In other words, the upper surface of the sealing member 60 including an area covering the semiconductor chip 311 is flat.

In the semiconductor device 300, the height of the upper surface of the first semiconductor chip 311 from the surface of the wiring substrate 10 is equal to the height of the upper surface of the second semiconductor chip 320 from the surface of the wiring substrate 10 as with the semiconductor device 100 of Embodiment 1. The height of the upper surface of the first semiconductor chip 311 from the surface of the wiring substrate 10, including the adhesive member 23 such as a DAF, is equal to the height of the upper surface of the second semiconductor chip 320 from the surface of the wiring substrate 10.

For example, the first semiconductor chip 311 has a thickness of 160 μm including the thickness of the adhesive member 23. For example, the semiconductor chip component 321 of the second semiconductor chip 320, which has a chip-layered structure, has a thickness of 40 μm. For example, the semiconductor chip component 322 has a thickness of 40 μm. For example, the spacer 323 has a thickness of 40 μm. The total thickness of three layers of the adhesive members 23 such as DAFs is 40 μm. Thus, the total thickness of the second semiconductor chip 320 is 160 μm.

In the semiconductor device 300 of Embodiment 2, the thickness from the upper surface of the first semiconductor chip 311 to the surface of the sealing member 60 is equal to the thickness from the upper surface of the second semiconductor chip (chip-layered structure) 320 to the surface of the sealing member 60 as with Embodiment 1. Therefore, the sealing member 60 is satisfactorily balanced on the wiring substrate 10. Thus, uneven torsion or strain is unlikely to be caused to the entire semiconductor device 300 by shrinkage of the sealing member 60 on curing. Therefore, the semiconductor device 300 is not inhibited from being mounted onto a motherboard. Furthermore, the thickness of the first semiconductor chip 311 is made equal to the thickness of the second semiconductor chip (chip-layered structure) 320. Accordingly, the amount of resin for the sealing member 60 can be reduced. Thus, further reduction in warp can be expected.

Since the spacer 323 is interposed between the semiconductor chip component 321 and the semiconductor chip component 322, risk of a short circuit between the wires 41 connecting the semiconductor chip component 321 and a rear face of the semiconductor chip component 322 can be lowered as compared to Embodiment 1, in which the wires 41 are embedded in the FOW.

Furthermore, in the semiconductor device 300, each of the first semiconductor chip 311 and the second semiconductor chip 320 has a bottom contacting the wiring substrate 10. The bottom of the first semiconductor chip 311 has the same area as the bottom of the second semiconductor chip 320.

Moreover, in the semiconductor device 300, the first semiconductor chip 311 and the second semiconductor chip 320 are mounted on the surface of the wiring substrate 10 at positions that are symmetrical with respect to each other.

Embodiment 3

A semiconductor device according to Embodiment 3 of the present invention differs from the semiconductor device according to Embodiment 1 in configuration of the semiconductor chip (chip-layered structure). The drawings and description of Embodiment 1 are cited to refer to components or operations that are the same as or similar to Embodiment 1. The details of those components or operations are omitted from the following description.

Figure 7:
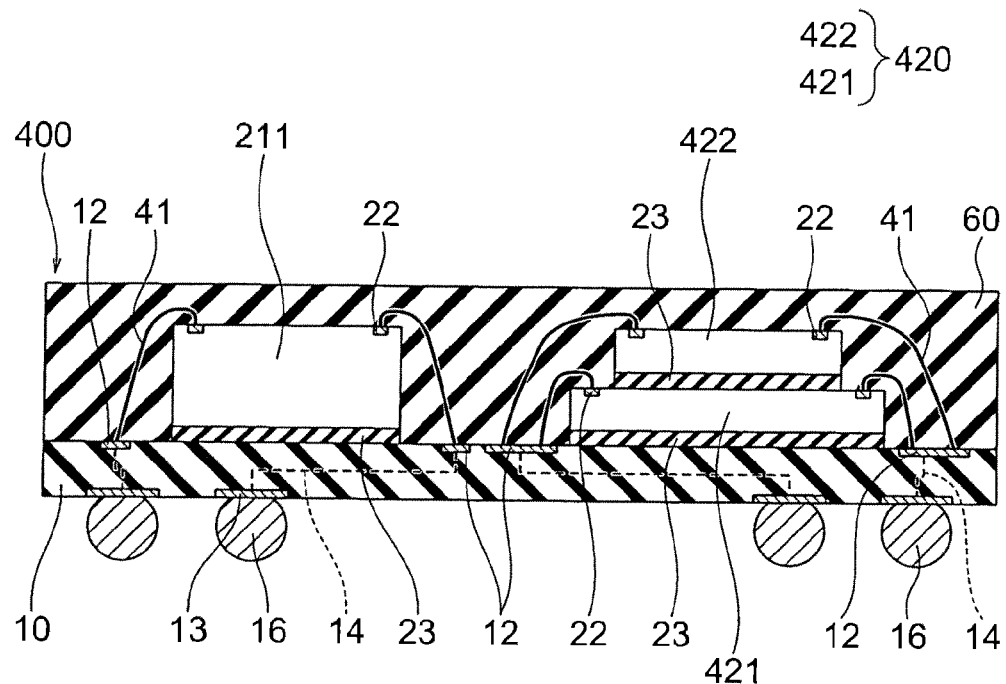
FIG. 7 is a cross-sectional view showing a semiconductor device according to Embodiment 3 of the present invention.

Referring to FIG. 7, a semiconductor device 400 according to Embodiment 3 of the present invention has a single wiring substrate 10, a first semiconductor chip 211 mounted on the wiring substrate 10, a second semiconductor chip 420 mounted next to the first semiconductor chip 211 on the wiring substrate 10, and a sealing member 60 covering the first semiconductor chip 211 and the second semiconductor chip 420.

For example, the wiring substrate 10 includes a glass epoxy substrate having a thickness of 0.2 mm. A predetermined wiring pattern is formed on the glass epoxy substrate.

The first semiconductor chip 211 and the second semiconductor chip 420 are mounted on the wiring substrate 10 by adhesive members 23. Examples of the adhesive members 23 include a die attached film (DAF).

The second semiconductor chip 420 has a chip-layered structure with a plurality of semiconductor chip components 421 and 422 stacked in the height direction of the semiconductor device 400. The upper semiconductor chip component 422 is stacked on the lower semiconductor chip component 421 with an adhesive member 23 such as a DAF being interposed between the semiconductor chip components 421 and 422.

Particularly, in Embodiment 3, the upper semiconductor chip component 422 is stacked on the lower semiconductor chip component 421 so that the electrode pads 22 of the lower semiconductor chip component 421, from which the wires 41 extend, are exposed. The upper semiconductor chip component 422 is stacked on the lower semiconductor chip component 421.

The first semiconductor chip 211 and the semiconductor chip components 421 and 422 of the second semiconductor chip 420 are connected to the connection pads 12 formed on the surface of the wiring substrate 10 by the wires 41 extending from the electrode pads 22.

The height of an upper surface of the sealing member 60 covering the first semiconductor chip 211 from the surface of the wiring substrate 10 is equal to the height of an upper surface of the sealing member 60 covering the second semiconductor chip 420 from the surface of the wiring substrate 10. In other words, the upper surface of the sealing member 60 including an area covering the semiconductor chip 211 is flat.

In the semiconductor device 400, the height of the upper surface of the first semiconductor chip 211 from the surface of the wiring substrate 10 is equal to the height of the upper surface of the second semiconductor chip 420 from the surface of the wiring substrate 10 as with the semiconductor device 100 of Embodiment 1. The height of the upper surface of the first semiconductor chip 211 from the surface of the wiring substrate 10, including the adhesive member 23 such as a DAF, is equal to the height of the upper surface of the second semiconductor chip 420 from the surface of the wiring substrate 10.

More specifically, for example, the first semiconductor chip 211 has a thickness of 160 μm including the thickness of the adhesive member 23. For example, the semiconductor chip component 421 of the second semiconductor chip 420, which has a chip-layered structure, has a thickness of 50 μm. For example, the semiconductor chip component 422 has a thickness of 50 μm. For example, the total thickness of two layers of the adhesive members 23 such as DAFs is 60 μm. Thus, the total thickness of the second semiconductor chip 420 is 160 μm.

In the semiconductor device 400 of Embodiment 3, the thickness from the upper surface of the first semiconductor chip 211 to the surface of the sealing member 60 is equal to the thickness from the upper surface of the second semiconductor chip (chip-layered structure) 420 to the surface of the sealing member 60 as with Embodiment 1. Therefore, the sealing member 60 is satisfactorily balanced on the wiring substrate 10. Thus, uneven torsion or strain is unlikely to be caused to the entire semiconductor device 400 by shrinkage of the sealing member 60 on curing. Therefore, the semiconductor device 400 is not inhibited from being mounted onto a motherboard. Furthermore, the thickness of the first semiconductor chip 211 is made equal to the thickness of the second semiconductor chip (chip-layered structure) 420. Accordingly, the amount of resin for the sealing member 60 can be reduced. Thus, further reduction in warp can be expected.

Since the upper semiconductor chip component 422 is stacked so that the electrode pads 22 of the lower semiconductor chip component 421, from which the wires 41 extend, are exposed, risk of a short circuit between the wires 41 connecting the semiconductor chip component 421 and a rear face of the semiconductor chip component 422 can be lowered as compared to Embodiment 1, in which the wires 41 are embedded in the FOW.

Furthermore, in the semiconductor device 400, each of the first semiconductor chip 211 and the second semiconductor chip 420 has a bottom contacting the wiring substrate 10. The bottom of the first semiconductor chip 211 has the same area as the bottom of the second semiconductor chip 420.

Moreover, in the semiconductor device 400, the first semiconductor chip 211 and the second semiconductor chip 420 are mounted on the surface of the wiring substrate 10 at positions that are symmetrical with respect to each other.

Embodiment 4

A semiconductor device according to Embodiment 4 of the present invention differs from the semiconductor device according to Embodiment 1 in configuration of the semiconductor chip (chip-layered structure). The drawings and description of Embodiment 1 are cited to refer to components or operations that are the same as or similar to Embodiment 1. The details of those components or operations are omitted from the following description.

Figure 8:
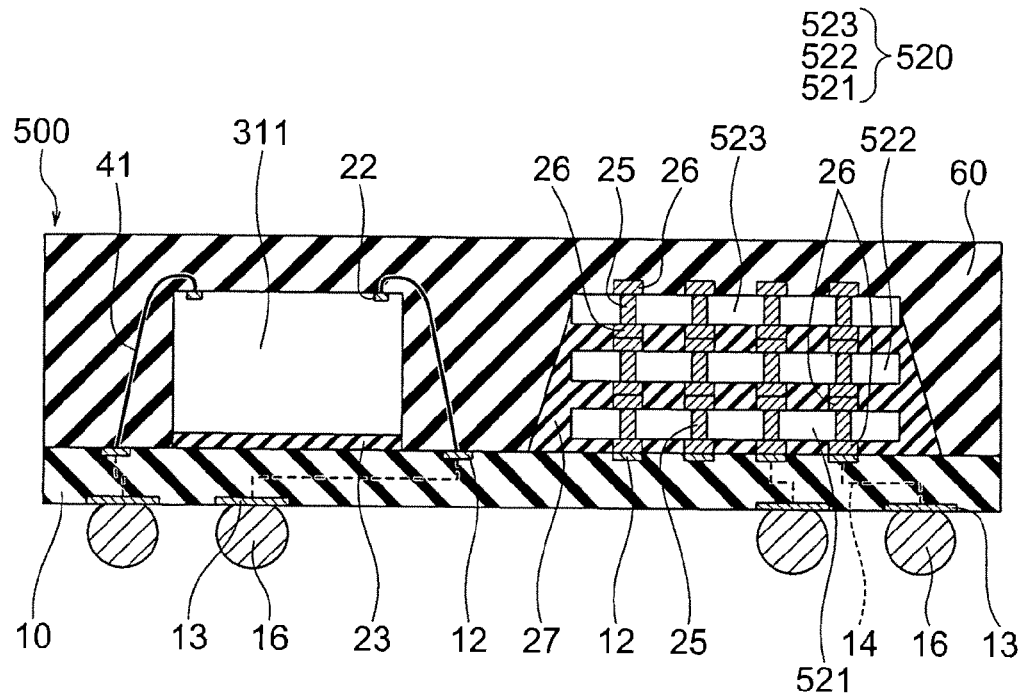
FIG. 8 is a cross-sectional view showing a semiconductor device according to Embodiment 4 of the present invention.

Referring to FIG. 8, a semiconductor device 500 according to Embodiment 4 of the present invention has a single wiring substrate 10, a first semiconductor chip 311 mounted on the wiring substrate 10, a second semiconductor chip 520 mounted next to the first semiconductor chip 311 on the wiring substrate 10, and a sealing member 60 covering the first semiconductor chip 311 and the second semiconductor chip 520.

For example the wiring substrate 10 includes a glass epoxy substrate having a thickness of 0.2 mm. A predetermined wiring pattern's formed on the glass epoxy substrate.

The first semiconductor chip 311 is mounted on the wiring substrate 10 by an adhesive member 23 Examples of the adhesive member 23 include a die attached film (OAF).

The second semiconductor chip 520 has a chip-layered structure with a plurality of semiconductor'chip components 521, 522, and 523 stacked in the height direction of the semiconductor device 500.

In the second semiconductor chip (chip-layered structure) 520 of Embodiment 4, each of the semiconductor chip components 521, 522, and 523 has through electrodes 25 extending through the semiconductor chip component along the thickness direction and bumps 26 formed on both surfaces of the semiconductor chip component. The through electrodes 25 are connected to internal circuits (not shown). The bumps 26 are electrically connected to the corresponding through electrodes 25.

The upper semiconductor chip component 522 is connected to the connection pads 12 formed on the surface of the wiring substrate 10 via the through electrodes 25 of the semiconductor chip component 522, the lower bumps 26 of the semiconductor chip component 522, the upper bumps 26 of the lower semiconductor chip component 521, the through electrodes 25 of the semiconductor chip component 521, and the lower bumps 26 of the semiconductor chip component 521. Similarly, the uppermost semiconductor chip component 523 is connected to the connection pads 12 formed on the surface of the wiring substrate 10 via the through electrodes 25 of the semiconductor chip component 523, the lower bumps 26 of the semiconductor chip component 523, the upper bumps 26 of the lower semiconductor chip component 522, the through electrodes 25 of the semiconductor chip component 522, the lower bumps 26 of the semiconductor chip component 522, and further the upper bumps 26 of the lower semiconductor chip component 521, the through electrodes 25 of the semiconductor chip component 521, and the lower bumps 26 of the semiconductor chip component 521.

For example, upper and lower bumps 26 of adjacent semiconductor chip components are bonded to each other by flip chip bonding. Specifically, a load is applied at a high temperature, e.g., about 300° C., to bond upper and lower bumps 26 of adjacent semiconductor chip components to each other. During flip chip bonding, ultrasonic waves may be applied in addition to the load.

The stacked semiconductor chip components 521, 522, and 523 are bonded and fixed by an underfilling material 27.

The height of an upper surface of the sealing member 60 covering the first semiconductor chip 311 from the surface of the wiring substrate 10 is equal to the height of an upper surface of the sealing member 60 covering the second semiconductor chip 520 from the surface of the wiring substrate 10. In other words, the upper surface of the sealing member 60 including an area covering the semiconductor chip 311 is flat.

In the semiconductor device 500, the height of the upper surface of the first semiconductor chip 311 from the surface of the wiring substrate 10 is equal to the height of the upper surface of the second semiconductor chip 520 from the surface of the wiring substrate 10 as with the semiconductor device 100 of Embodiment 1. The height of the upper surface of the first semiconductor chip 311 from the surface of the wiring substrate 10, including the adhesive member 23 such as a DAF, is equal to the height of the upper surface of the second semiconductor chip 520 from the surface of the wiring substrate 10.

More specifically, for example, the first semiconductor chip 311 has a thickness of 160 μm including the thickness of the adhesive member 23. For example, the total thickness of the second semiconductor chip 520, which has a chip-layered structure, is 160 μm.

In the semiconductor device 500 of Embodiment 4, the thickness from the upper surface of the first semiconductor chip 311 to the surface of the sealing member 60 is equal to the thickness from the upper surface of the second semiconductor chip (chip-layered structure) 520 to the surface of the sealing member 60 as with Embodiment 1. Therefore, the sealing member 60 is satisfactorily balanced on the wiring substrate 10. Thus, uneven torsion or strain is unlikely to be caused to the entire semiconductor device 500 by shrinkage of the sealing member 60 on curing. Therefore, the semiconductor device 500 is not inhibited from being mounted onto a motherboard. Furthermore, the thickness of the first semiconductor chip 311 is made equal to the thickness of the second semiconductor chip (chip-layered structure) 520. Accordingly, the amount of resin for the sealing member 60 can be reduced. Thus, further reduction in warp can be expected.

Furthermore, in Embodiment 4, the semiconductor chip components are connected to the wiring substrate without use of wires by the through electrodes and the bumps formed on the semiconductor chip components of the chip-layered structure. Therefore, risk of a short circuit between wires and the semiconductor chip components can be lowered as compared to Embodiment 1, in which the wires 41 are embedded in the FOW. Moreover, since the semiconductor chip components of the chip-layered structure are electrically connected by the through electrodes, increase in capacity and high-speed transmission of signals can be achieved.

Furthermore, in the semiconductor device 500, each of the first semiconductor chip 311 and the second semiconductor chip 520 has a bottom contacting the wiring substrate 10. The bottom of the first semiconductor chip 311 has the same area as the bottom of the second semiconductor chip 520.

Moreover, in the semiconductor device 500, the first semiconductor chip 311 and the second semiconductor chip 520 are mounted on the surface of the wiring substrate 10 at positions that are symmetrical with respect to each other.

The present invention is not limited to the aforementioned embodiments. It should be understood that various modifications and changes may be made therein without departing from the spirit of the present invention.

For example, in the above embodiments, the thickness of the first semiconductor chip is mainly adjusted so that the upper surfaces of the first semiconductor chip and the second semiconductor chip (chip-layered structure), which are mounted next to each other on the wiring substrate, are located at substantially the same height. Nevertheless, the present invention is applicable to a semiconductor device having three or more semiconductor chips, irrespective of a single chip or a chip-layered structure. Furthermore, when the height of the semiconductor chips is adjusted between those semiconductor chips, the height of the chip-layered structure may be adjusted depending upon the height of the single chip.

Furthermore, in the above embodiments, the semiconductor chip components of the chip-layered structure are configured to have the same thickness. Nevertheless, the semiconductor chip components may have different thicknesses as long as the upper and lower surfaces of the chip-layered structure are located on the same planes as those of the first semiconductor chip.

In the aforementioned embodiments, the first semiconductor chip is adjusted to have substantially the same thickness as the chip-layered structure. Nevertheless, the present invention is applicable to a semiconductor device having two mounting areas on which different numbers of semiconductor chips are stacked. For example, a layered structure of two chips and a layered structure of three chips may be mounted on a semiconductor device.

All or part of the above embodiments can be described as in the following notes. Nevertheless, the present invention is not limited to those notes.

The whole or part of the exemplary embodiment disclosed above can be described as the following supplementary notes, but is not limited to them.

(Supplementary Note 1) A semiconductor device comprising: a wiring substrate; a first semiconductor chip mounted on the wiring substrate; a second semiconductor chip mounted on the wiring substrate so that an upper surface of the first semiconductor chip is located at the same height from a surface of the wiring substrate as an upper surface of the second semiconductor chip, the second semiconductor chip having a chip-layered structure with a plurality of semiconductor chip components stacked in a height direction of the semiconductor device; and a sealing member covering the first semiconductor chip and the second semiconductor.

(Supplementary Note 2) The semiconductor device as described in Supplementary Note 1, wherein each of the first semiconductor chip and the second semiconductor chip is mounted on the wiring substrate by an adhesive member, and a height of the upper surface of the first semiconductor chip from the surface of the wiring substrate, including a thickness of the adhesive member, is equal to a height of the upper surface of the second semiconductor chip from the surface of the wiring substrate, including a thickness of the adhesive member.

(Supplementary Note 3) The semiconductor device as described in Supplementary Note 1 or 2, wherein an upper surface of the sealing member covering the first semiconductor chip is located at the same height from the surface of the wiring substrate as an upper surface of the sealing member covering the second semiconductor chip.

(Supplementary Note 4) The semiconductor device as described in any of Supplementary Notes 1 to 3, wherein each of the first semiconductor chip and the second semiconductor chip has a bottom contacting the wiring substrate, and the bottom of the first semiconductor chip has the same area as the bottom of the second semiconductor chip.

(Supplementary Note 5) The semiconductor device as described in any of Supplementary Notes 1 to 4, wherein the first semiconductor chip and the second semiconductor chip are mounted on the wiring substrate at positions that are symmetrical with respect to each other.

(Supplementary Note 6) The semiconductor device as described in any of Supplementary Notes 1 to, wherein the plurality of semiconductor chip components of the second semiconductor chip are stacked with an adhesive member being interposed therebetween.

(Supplementary Note 7) The semiconductor device as described in any of Supplementary Notes 1 to 5, wherein the first semiconductor chip and the plurality of semiconductor chip components of the second semiconductor chip are respectively connected to connection pads formed on the surface of the wiring substrate by wires, and an upper one of the semiconductor chip components is stacked on a lower one of the semiconductor chip components with a film-on-wire being interposed between the upper one of the semiconductor chip components and the lower one of the semiconductor chip components.

(Supplementary Note 8) The semiconductor device as described in any of Supplementary Notes 1 to 6, wherein the first semiconductor chip and the plurality of semiconductor chip components of the second semiconductor chip are respectively connected to connection pads formed on the surface of the wiring substrate by wires, the semiconductor device further comprises a spacer stacked on a lower one of the semiconductor chip components so that a portion of the lower one of the semiconductor chip components from which the wires extend is exposed, and an upper one of the semiconductor chip components is stacked on the lower one of the semiconductor chip components with the spacer being interposed between the upper one of the semiconductor chip components and the lower one of the semiconductor chip components.

(Supplementary Note 9) The semiconductor device as described in any of Supplementary Notes 1 to 6, wherein the first semiconductor chip and the plurality of semiconductor chip components of the second semiconductor chip are respectively connected to connection pads formed on the surface of the wiring substrate by wires, and an upper one of the semiconductor chip components is stacked on a lower one of the semiconductor chip components so that a portion of the lower one of the semiconductor chip components from which the wires extend is exposed.

(Supplementary Note 10) The semiconductor device as described in any of Supplementary Notes 1 to 6, wherein each of the semiconductor chip components of the second semiconductor chip has a through electrode extending through the semiconductor chip component in a thickness direction of the semiconductor chip component and bumps formed on both surfaces of the semiconductor chip component, the bumps being electrically connected to the through electrode. An upper one of the semiconductor chip components is connected to a connection pad formed on the surface of the wiring substrate via the through electrode in the upper one of the semiconductor chip components, a lower one of the bumps on the upper one of the semiconductor chip components, an upper one of the bumps on a lower one of the semiconductor chip components, the through electrode in the lower one of the semiconductor chip components, and a lower one of the bumps on the lower one of the semiconductor chip components.

(Supplementary Note 11) A semiconductor device comprising: a wiring substrate including a first region and a second region; a first semiconductor chip mounted over the first region of the wiring substrate; a second semiconductor chip including a first surface and a second surface opposed to the first surface, and the second semiconductor chip stacked over the first semiconductor chip so that the second surface faces the first semiconductor chip; a third semiconductor chip including a third surface and a fourth surface opposed to the third surface, the third semiconductor chip being mounted over the second region of the wiring substrate so that the fourth surface faces the wiring substrate; and an insulating layer formed over the wiring substrate to cover the first, second and third semiconductor chips, the insulating layer including an exposed surface facing away from the wiring substrate. A distance between the third surface of the third semiconductor chip and the exposed surface of the insulating layer is substantially equal to a distance between the first surface of the second semiconductor chip and the exposed surface of the insulating layer.

(Supplementary Note 12) The semiconductor device as described in Supplementary Note 11, wherein the third semiconductor chip is thicker than each of the first and second semiconductor chips.

(Supplementary Note 13) The semiconductor device as described in Supplementary Note 11, wherein the wiring substrate includes a plurality of connection pads thereon. The second semiconductor chip includes a plurality of first electrodes formed on the first surface, each of the first electrodes being electrically coupled to a corresponding one of the connection pads via a first wire, and the third semiconductor chip includes a plurality of second electrodes formed on the third surface, each of the second electrodes being electrically coupled to a corresponding one of the connection pads via a second wire.

(Supplementary Note 14) The semiconductor device as described in Supplementary Note 11, wherein the first semiconductor chip is mounted over the first region of the wiring substrate via a first adhesive. The second semiconductor chip is stacked over the first semiconductor chip via a second adhesive. The third semiconductor chip is mounted over the second region of the wiring substrate via a third adhesive. The second adhesive is thicker than the first adhesive.

(Supplementary Note 15) The semiconductor device as described in Supplementary Note 14, wherein the third adhesive is thicker than each of the first and second adhesive.

(Supplementary Note 16) The semiconductor device as described in Supplementary Note 14, wherein the first semiconductor chip includes a fifth surface, a sixth surface opposed to the fifth surface and a plurality of third electrodes formed on the fifth surface. The sixth surface faces the wiring substrate. Each of the third electrodes is electrically coupled to a corresponding one of the connection pads via a third wire. The third wire is buried in the second adhesive.

(Supplementary Note 17) The semiconductor device as described in Supplementary Note 11, further comprising: A spacer or a fourth semiconductor chip provided between the first and second semiconductor chips.

(Supplementary Note 18) The semiconductor device as described in Supplementary Note 11, wherein the first semiconductor chip is larger in size than the second semiconductor chip.

(Supplementary Note 19) The semiconductor device as described in Supplementary Note 11, wherein each of the first and second semiconductor chips includes a through electrode, the first semiconductor chip being electrically coupled to the second semiconductor chip via the through electrode.

(Supplementary Note 20) A semiconductor device comprising: a wiring substrate including a top surface and a plurality of connection pads formed on the top surface, the top surface including a first region and a second region; a first semiconductor chip including a first surface and a plurality of first electrodes formed on the first surface, the first semiconductor chip being mounted over the first region of the wiring substrate; a second semiconductor chip including a second surface, a third surface opposed to the second surface and a plurality of second electrodes formed on the second surface, the second semiconductor chip being stacked over the first semiconductor chip so that the third surface faces the first semiconductor chip; a third semiconductor chip including a fourth surface, a fifth surface opposed to the fourth surface and a plurality of third electrodes formed on the fourth surface, the third semiconductor chip being mounted over the second region of the wiring substrate so that the fifth surface faces the wiring substrate; a plurality of first wires electrically coupling the first electrodes of the first semiconductor chip to the connection pads of the wiring substrate; a plurality of second wires electrically coupling the second electrodes of the second semiconductor chip to the connection pads of the wiring substrate; a plurality of third wires electrically coupling the third electrodes of the third semiconductor chip to the connection pads of the wiring substrate; and an insulating layer formed over the top surface of the wiring substrate to cover the first semiconductor chip, the second semiconductor chip, third semiconductor chip, the first wires, the second wires and the third wires. A height of the fourth surface of the third semiconductor chip from the top surface of the wiring substrate is substantially equal to a height of the second surface of the second semiconductor chip from the top surface of the wiring substrate.

(Supplementary Note 21) A method of manufacturing a semiconductor device, the method comprising: mounting a first semiconductor chip and a second semiconductor chip on a wiring substrate so that an upper surface of the first semiconductor chip is located at the same height from a surface of the wiring substrate as an upper surface of the second semiconductor chip, the mounting process including stacking a plurality of semiconductor chip components in a height direction of the semiconductor device to form the second semiconductor chip having a chip-layered structure; and covering the first semiconductor chip and the second semiconductor chip mounted on the wiring substrate with a sealing member.

(Supplementary Note 22) The method as described in Supplementary Note 21, wherein each of the first semiconductor chip and the second semiconductor chip is mounted on the wiring substrate by an adhesive member, and the mounting process includes mounting the first semiconductor chip and the second semiconductor chip so that a height of an upper surface of the first semiconductor chip from a surface of the wiring substrate, including a thickness of the adhesive member, is equal to a height of an upper surface of the second semiconductor chip from a surface of the wiring substrate, including a thickness of the adhesive member.

(Supplementary Note 23) The method as described in Supplementary Note 21 or 22, wherein the covering process includes forming the sealing member so that an upper surface of the sealing member covering the first semiconductor chip is located at the same height from the surface of the wiring substrate as an upper surface of the sealing member covering the second semiconductor chip.

(Supplementary Note 24) The method as described in any of Supplementary Notes 21 to 23, wherein each of the first semiconductor chip and the second semiconductor chip has a bottom contacting the wiring substrate, and the bottom of the first semiconductor chip has the same area as the bottom of the second semiconductor chip.

(Supplementary Note 25) The method as described in any of Supplementary Notes 21 to 24, wherein the mounting process includes mounting the first semiconductor chip and the second semiconductor chip on the wiring substrate at positions that are symmetrical with respect to each other.

(Supplementary Note 26) The method as described in any of Supplementary Notes 21 to 25, wherein the stacking process of the mounting process includes stacking the plurality of semiconductor chip components of the second semiconductor chip with an adhesive member being interposed between the semiconductor chip components.

(Supplementary Note 27) The method as described in any of Supplementary Notes 21 to 26, further comprising connecting the first semiconductor chip and the plurality of semiconductor chip components of the second semiconductor chip respectively to connection pads formed on the surface of the wiring substrate by wires, wherein the stacking process of the mounting process includes stacking an upper one of the semiconductor chip components on a lower one of the semiconductor chip components with a film-on-wire being interposed between the upper one of the semiconductor chip components and the lower one of the semiconductor chip components.

(Supplementary Note 28) The method as described in any of Supplementary Notes 21 to 26, further comprising connecting the first semiconductor chip and the plurality of semiconductor chip components of the second semiconductor chip respectively to connection pads formed on the surface of the wiring substrate by wires, wherein the stacking process of the mounting process includes: stacking a spacer on a lower one of the semiconductor chip components so that a portion of the lower one of the semiconductor chip components from which the wires extend is exposed, and stacking an upper one of the semiconductor chip components on the lower one of the semiconductor chip components with the spacer being interposed between the upper one of the semiconductor chip components and the lower one of the semiconductor chip components.

(Supplementary Note 29) The method as described in any of Supplementary Notes 21 to 26, further comprising connecting the first semiconductor chip and the plurality of semiconductor chip components of the second semiconductor chip respectively to connection pads formed on the surface of the wiring substrate by wires, wherein the stacking process of the mounting process includes stacking an upper one of the semiconductor chip components on a lower one of the semiconductor chip components so that a portion of the lower one of the semiconductor chip components from which the wires extend is exposed.

(Supplementary Note 30) The method as described in any of Supplementary Notes 1 to 16, further comprising: forming a through electrode extending through each of the semiconductor chip components of the second semiconductor chip in a thickness direction of the semiconductor chip component and bumps on both surfaces of the semiconductor chip component so that the bumps are electrically connected to the through electrode; and connecting an upper one of the semiconductor chip components to a connection pad formed on the surface of the wiring substrate via the through electrode in the upper one of the semiconductor chip components, a lower one of the bumps on the upper one of the semiconductor chip components, an upper one of the bumps on a lower one of the semiconductor chip components, the through electrode in the lower one of the semiconductor chip components, and a lower one of the bumps on the lower one of the semiconductor chip components.

What is claimed is:

1. A semiconductor device comprising:
a wiring substrate;
a first semiconductor chip mounted on the wiring substrate;
a second semiconductor chip mounted on the wiring substrate so that an upper surface of the first semiconductor chip is located at the same height from a surface of the wiring substrate as an upper surface of the second semiconductor chip, the second semiconductor chip having a chip-layered structure with a plurality of semiconductor chip components stacked in a height direction of the semiconductor device; and
a sealing member covering the first semiconductor chip and the second semiconductor chip, the sealing member including an exposed surface facing away from the wiring substrate, the exposed surface being without any other substrate formed thereon,
wherein the first semiconductor chip comprises a single semiconductor chip component and is thicker than each of the semiconductor chip components of the second semiconductor chip.

2. The semiconductor device according to claim 1, wherein each of the first semiconductor chip and the second semiconductor chip is mounted on the wiring substrate by an adhesive member, and
a height of the upper surface of the first semiconductor chip from the surface of the wiring substrate, including a thickness of the adhesive member, is equal to a height of the upper surface of the second semiconductor chip from the surface of the wiring substrate, including a thickness of the adhesive member.

3. The semiconductor device according to claim 1, wherein an upper surface of the sealing member covering the first semiconductor chip is located at the same height from the surface of the wiring substrate as an upper surface of the sealing member covering the second semiconductor chip.

4. The semiconductor device according to claim 1, wherein each of the first semiconductor chip and the second semiconductor chip has a bottom contacting the wiring substrate, and
the bottom of the first semiconductor chip has the same area as the bottom of the second semiconductor chip.

5. The semiconductor device according to claim 1, wherein the first semiconductor chip and the second semiconductor chip are mounted on the wiring substrate at positions that are symmetrical with respect to each other.

6. The semiconductor device according to claim 1, wherein the plurality of semiconductor chip components of the second semiconductor chip are stacked with an adhesive member being interposed therebetween.

7. The semiconductor device according to claim 1, wherein the first semiconductor chip and the plurality of semiconductor chip components of the second semiconductor chip are respectively connected to connection pads formed on the surface of the wiring substrate by wires, and
an upper one of the semiconductor chip components is stacked on a lower one of the semiconductor chip components of the second semiconductor chip with a film-on-wire being interposed between the upper one of the semiconductor chip components of the second semiconductor chip and the lower one of the semiconductor chip components of the second semiconductor chip.

8. The semiconductor device according to claim 1, wherein the first semiconductor chip and the plurality of semiconductor chip components of the second semiconductor chip are respectively connected to connection pads formed on the surface of the wiring substrate by wires,
the semiconductor device further comprises a spacer stacked on a lower one of the semiconductor chip components of the second semiconductor chip so that a portion of the lower one of the semiconductor chip components of the second semiconductor chip from which the wires extend is exposed, and
an upper one of the semiconductor chip components of the second semiconductor chip is stacked on the lower one of the semiconductor chip components of the second semiconductor chip with the spacer being interposed between the upper one of the semiconductor chip components of the second semiconductor chip and the lower one of the semiconductor chip components of the second semiconductor chip.

9. The semiconductor device according to claim 1, wherein the first semiconductor chip and the plurality of semiconductor chip components of the second semiconductor chip are respectively connected to connection pads formed on the surface of the wiring substrate by wires, and
an upper one of the semiconductor chip components of the second semiconductor chip is stacked on a lower one of the semiconductor chip components of the second semiconductor chip so that a portion of the lower one of the semiconductor chip components of the second semiconductor chip from which the wires extend is exposed.

10. The semiconductor device according to claim 1, wherein each of the semiconductor chip components of the second semiconductor chip has a through electrode extending through the semiconductor chip component of the second semiconductor chip in a thickness direction of the semiconductor chip component of the second semiconductor chip and bumps formed on both surfaces of the semiconductor chip component of the second semiconductor chip, the bumps being electrically connected to the through electrode, and
an upper one of the semiconductor chip components of the second semiconductor chip is connected to a connection pad formed on the surface of the wiring substrate via the through electrode in the upper one of the semiconductor chip components of the second semiconductor chip, a lower one of the bumps on the upper one of the semiconductor chip components of the second semiconductor chip, an upper one of the bumps on a lower one of the semiconductor chip components of the second semiconductor chip, the through electrode in the lower one of the semiconductor chip components of the second semiconductor chip, and a lower one of the bumps on the lower one of the semiconductor chip components of the second semiconductor chip.

11. The semiconductor device according to claim 1, wherein the wiring substrate includes a plurality of connection pads thereon, and the first semiconductor chip includes a first surface facing to the wiring substrate, a second surface opposite to the first surface, and a plurality of first electrodes formed on the second surface, and each of the first electrodes is electrically coupled to a corresponding one of the connection pads via a first wire.

12. The semiconductor device according to claim 1, wherein an entire area of the exposed surface of the sealing member is flat.

13. A semiconductor device comprising:
a wiring substrate including a first region and a second region;
a first semiconductor chip mounted over the first region of the wiring substrate;
a second semiconductor chip including a first surface and a second surface opposed to the first surface, and the second semiconductor chip being stacked over the first semiconductor chip so that the second surface faces the first semiconductor chip;
a third semiconductor chip including a third surface and a fourth surface opposed to the third surface, the third semiconductor chip being mounted over the second region of the wiring substrate so that the fourth surface faces the wiring substrate; and
an insulating layer formed over the wiring substrate to cover the first, second and third semiconductor chips, the insulating layer including an exposed surface facing away from the wiring substrate, the exposed surface being without any other substrate formed thereon,
wherein a distance between the third surface of the third semiconductor chip and the exposed surface of the insulating layer is substantially equal to a distance between the first surface of the second semiconductor chip and the exposed surface of the insulating layer,
wherein the third semiconductor chip is thicker than each of the first and second semiconductor chips.

14. The semiconductor device according to claim 13, wherein the wiring substrate includes a plurality of connection pads thereon,
the second semiconductor chip includes a plurality of first electrodes formed on the first surface, each of the first electrodes being electrically coupled to a corresponding one of the connection pads via a first wire, and
the third semiconductor chip includes a plurality of second electrodes formed on the third surface, each of the second electrodes being electrically coupled to a corresponding one of the connection pads via a second wire.

15. The semiconductor device according to claim 13, further comprising:
a spacer or a fourth semiconductor chip provided between the first and second semiconductor chips.

16. The semiconductor device according to claim 13, wherein the first semiconductor chip is larger in size than the second semiconductor chip.

17. The semiconductor device according to claim 13, wherein each of the first and second semiconductor chips includes a through electrode, the first semiconductor chip being electrically coupled to the second semiconductor chip via the through electrode.

18. The semiconductor device according to claim 13, wherein the wiring substrate includes a plurality of connection pads thereon, and
the third semiconductor chip includes a plurality of first electrodes formed on the third surface, and each of the first electrodes is electrically coupled to a corresponding one of the connection pads via a first wire.

19. The semiconductor device according to claim 13, wherein an entire area of the exposed surface of the insulating layer is flat.

20. A semiconductor device comprising:
a wiring substrate including a first region and a second region; a first semiconductor chip mounted over the first region of the wiring substrate;
a second semiconductor chip including a first surface and a second surface opposed to the first surface, and the second semiconductor chip being stacked over the first semiconductor chip so that the second surface faces the first semiconductor chip;
a third semiconductor chip including a third surface and a fourth surface opposed to the third surface, the third semiconductor chip being mounted over the second region of the wiring substrate so that the fourth surface faces the wiring substrate; and
an insulating layer formed over the wiring substrate to cover the first, second and third semiconductor chips, the insulating layer including an exposed surface facing away from the wiring substrate, the exposed surface being without any other substrate formed thereon
wherein a distance between the third surface of the third semiconductor chip and the exposed surface of the insulating layer is substantially equal to a distance between the first surface of the second semiconductor chip and the exposed surface of the insulating layer,
wherein the first semiconductor chip is mounted over the first region of the wiring substrate via a first adhesive,
the second semiconductor chip is stacked over the first semiconductor chip via a second adhesive, and
the third semiconductor chip is mounted over the second region of the wiring substrate via a third adhesive, and
the second adhesive is thicker than the first adhesive.

21. The semiconductor device according to claim 20, wherein the third adhesive is thicker than each of the first and second adhesive.

22. The semiconductor device according to claim 20, wherein the first semiconductor chip includes a fifth surface, a sixth surface opposed to the fifth surface and a plurality of third electrodes formed on the fifth surface,
the sixth surface faces the wiring substrate,
each of the third electrodes is electrically coupled to a corresponding one of the connection pads via a third wire, and
the third wire is buried in the second adhesive.

23. A semiconductor device comprising:
a wiring substrate including a top surface and a plurality of connection pads formed on the top surface, the top surface including a first region and a second region;
a first semiconductor chip including a first surface and a plurality of first electrodes formed on the first surface, the first semiconductor chip being mounted over the first region of the wiring substrate;
a second semiconductor chip including a second surface, a third surface opposed to the second surface and a plurality of second electrodes formed on the second surface, the second semiconductor chip being stacked over the first semiconductor chip so that the third surface faces the first semiconductor chip;
a third semiconductor chip including a fourth surface, a fifth surface opposed to the fourth surface and a plurality of third electrodes formed on the fourth surface, the third semiconductor chip being mounted over the second region of the wiring substrate so that the fifth surface faces the wiring substrate;
a plurality of first wires electrically coupling the first electrodes of the first semiconductor chip to the connection pads of the wiring substrate;
a plurality of second wires electrically coupling the second electrodes of the second semiconductor chip to the connection pads of the wiring substrate;
a plurality of third wires electrically coupling the third electrodes of the third semiconductor chip to the connection pads of the wiring substrate; and
an insulating layer formed over the top surface of the wiring substrate to cover the first semiconductor chip, the second semiconductor chip, third semiconductor chip, the first wires, the second wires and the third wires,
wherein a height of the fourth surface of the third semiconductor chip from the top surface of the wiring substrate is substantially equal to a height of the second surface of the second semiconductor chip from the top surface of the wiring substrate.

* * * * *